United States Patent
Pfeffer et al.

(10) Patent No.: US 11,982,431 B2
(45) Date of Patent: May 14, 2024

(54) LED LIGHTING MODULE

(71) Applicant: Lumileds LLC, San Jose, CA (US)

(72) Inventors: Nicola Bettina Pfeffer, Eindhoven (NL); Frederic Stephane Diana, Santa Clara, CA (US); Kevin-Gx Jiao, Shanghai (CN); Charles André Schrama, San Jose, CA (US); Arjen Gerben Van der Sijde, Eindhoven (NL); Alan Andrew McReynolds, Los Altos, CA (US); Yifeng Qiu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/926,974

(22) PCT Filed: May 20, 2021

(86) PCT No.: PCT/US2021/033469
§ 371 (c)(1),
(2) Date: Nov. 21, 2022

(87) PCT Pub. No.: WO2021/236966
PCT Pub. Date: Nov. 25, 2021

(65) Prior Publication Data
US 2023/0204198 A1    Jun. 29, 2023

Related U.S. Application Data

(60) Provisional application No. 63/028,922, filed on May 22, 2020.

(30) Foreign Application Priority Data

Jul. 27, 2020   (EP) .................................... 20187919

(51) Int. Cl.
*F21V 23/00*    (2015.01)
*F21S 4/22*    (2016.01)
(Continued)

(52) U.S. Cl.
CPC .............. *F21V 23/005* (2013.01); *F21S 4/22* (2016.01); *G03B 15/03* (2013.01);
(Continued)

(58) Field of Classification Search
CPC .......... F21V 23/005; F21S 4/22; H05B 45/30; H04N 23/56; H04N 23/57; G03B 15/03;
(Continued)

(56) References Cited

U.S. PATENT DOCUMENTS 10,495,946 B2 * 12/2019 Shoemake ............. H04N 7/142
2005/0217457 A1 * 10/2005 Yamamoto ............. A63J 17/00
84/464 R (Continued)

FOREIGN PATENT DOCUMENTS

CN    115867747 A    3/2023
JP    2005316410 A    11/2005
(Continued)

OTHER PUBLICATIONS

"European Application Serial No. 20187919.4, Extended European Search Report dated Dec. 4, 2020", 8 pgs.
(Continued)

*Primary Examiner* — Bao Q Truong
(74) *Attorney, Agent, or Firm* — Schwegman, Lundberg & Woessner, P.A.

(57) ABSTRACT

A LED lighting module is described that is realized as a printed circuit assembly. The LED lighting module has a carrier with a strip of dielectric material and conductive circuit tracks printed on the dielectric material. Bare LED dies are mounted in a linear formation on the carrier. The (Continued)

width of the LED die formation does not exceed 0.75 mm and the area of the emission face of an LED die does not exceed 0.0625 mm2. Drivers are mounted on the carrier and are connected to drive the LED dies.

20 Claims, 5 Drawing Sheets

(51) Int. Cl.
    *G03B 15/03*       (2021.01)
    *H04M 1/02*        (2006.01)
    *H04N 23/56*      (2023.01)
    *H04N 23/57*      (2023.01)
    *H05B 45/30*      (2020.01)
    *F21Y 115/10*     (2016.01)

(52) U.S. Cl.
    CPC .......... *H04M 1/0264* (2013.01); *H04N 23/56* (2023.01); *H04N 23/57* (2023.01); *H05B 45/30* (2020.01); *F21Y 2115/10* (2016.08); *G03B 2215/0567* (2013.01)

(58) Field of Classification Search
    CPC ......... G03B 2215/0567; H04M 1/0264; F21Y 2115/10
    See application file for complete search history.

(56) References Cited

U.S. PATENT DOCUMENTS

| | | | |
|---|---|---|---|
| 2011/0069027 | A1 | 3/2011 | Kim et al. |
| 2013/0021811 | A1* | 1/2013 | Goldwater ................ B62J 6/01 362/249.04 |
| 2014/0055978 | A1* | 2/2014 | Gantz .................... A45C 11/00 362/458 |
| 2014/0062316 | A1 | 3/2014 | Tischler et al. |
| 2017/0061867 | A1 | 3/2017 | Cok et al. |
| 2019/0081299 | A1* | 3/2019 | Chiang .................. H02J 7/342 |
| 2019/0360673 | A1 | 11/2019 | Seo |
| 2020/0002024 | A1 | 1/2020 | Johannessen et al. |

FOREIGN PATENT DOCUMENTS

| | | |
|---|---|---|
| JP | 2019184741 A | 10/2019 |
| JP | 2020057015 A | 4/2020 |
| KR | 20100027546 A | 3/2010 |
| KR | 20190000064 A | 1/2019 |
| WO | WO-2019159985 A1 | 8/2019 |
| WO | WO-2021236966 A1 | 11/2021 |

OTHER PUBLICATIONS

"International Application Serial No. PCT/US2021/033469, International Preliminary Report on Patentability dated Jul. 18, 2022", 4 pgs.

"International Application Serial No. PCT/US2021/033469, International Search Report dated Sep. 7, 2021", 4 pgs.

"International Application Serial No. PCT/US2021/033469, Written Opinion dated Sep. 7, 2021", 5 pgs.

"European Application Serial No. 21808331.9, Response to Communication pursuant to Rules 161(2) and 162 EPC filed Mar. 21, 2023", 18 pgs.

"Japanese Application Serial No. 2022-571872, Notification of Reasons for Rejection mailed Dec. 26, 23", W/English Translation, 13 pgs.

\* cited by examiner

LED LIGHTING MODULE

CLAIM OF PRIORITY

This application is a U.S. National Stage Filing under 35 U.S.C. 371 from International Application No. PCT/US2021/033469, filed on May 20, 2021, which claims the benefit of priority of U.S. Provisional Patent Application Ser. No. 63/028,922, filed on May 22, 2020 and EP 20187919.4, filed Jul. 27, 2020, which are herein incorporated by reference in their entireties.

BACKGROUND

Electronic components such as packaged LEDs, ICs etc. can be mounted onto flexible printed circuit (FPC) carriers and sold as flexible printed circuit assemblies (FPCAs). For example, flexible strips carrying individually controllable LED modules are known from the prior art and are referred to as "modular light strips", since they can be cut to size and connected to a controller. A light strip may be sold on a roll that is several meters in length and populated with individually addressable LED modules such as WS2812s. Each LED module is packaged to contain a driver IC (e.g. a WS2811 IC) and several LED dies, usually as an RGB group so that light of any color can be emitted by the module. A clear epoxy dome covers the driver and LED dies and protects them from damage, while also acting as a lens. Each LED module is soldered in place on the flexible carrier. The LED modules are serially connected so that the data output signal of one module is the data input signal of the next module, etc. The color of the light emitted by each module is determined by the pulse string generated by the controller.

Such light strips can be used in various lighting applications such as decorative interior lighting. However, they cannot be used in small devices such as smartphones, tablets, etc. Such mobile devices generally only incorporate LEDs for very specific purposes, for example in a flash module of a camera unit.

BRIEF DESCRIPTION OF THE DRAWINGS

In the drawings, like numbers refer to like objects throughout. Objects in the diagrams are not necessarily drawn to scale.

DETAILED DESCRIPTION

The LED lighting module described above may be realized as a printed circuit assembly and include a carrier made of a strip of dielectric material on which conductive circuit tracks are printed and a plurality of bare LED dies mounted in a linear formation on the carrier. The width of the LED die formation, in some embodiments, does not exceed 0.75 mm and the area of the emission face of an LED die does not exceed 0.0625 mm$^2$. In some embodiments, a number of drivers are mounted on the carrier and connected to drive the LED dies.

The LED lighting module may use a narrow and compact lightbar that is achieved by leaving the LED dies "bare" instead of packaging them together with a driver IC.

The width of the LED die formation can be narrow, for example less than 1.0 mm. This means that the LED lighting module can easily be adapted for incorporation in space-constrained applications.

The LED dies shall be understood to comprise LEDs with a side length in the order of 0.25 mm. Such an LED is larger than a micro-LED used in an LED display (which uses a small pixel size to achieve a desired high resolution), and smaller than a high-power LED that is usually implemented in a camera flash of a mobile device (such a high-power LED generally has a surface area in the order of 1 mm$^2$). In the following, the LEDs of the LED lighting module may be referred to as "mini-LEDs".

The absolute amount of light emitted by a mini-LED in some embodiments is less than that of a comparable 1 mm$^2$ high-power LED, but the relative amount of light emitted by a mini-LED per area is comparable with that of a 1 mm$^2$ high-power LED. A sufficiently large number of mini-LEDs in the LED lighting module can therefore collectively deliver a similar amount of light. For example, twenty or more mini-LEDs may together achieve a luminous flux comparable to that of a 1 mm$^2$ high-power LED.

The LED lighting module can be made to assume any of a wide variety of forms and can therefore be incorporated in different devices in such a way as to complement or augment the characteristic "look" of each device. Because the width of the dielectric carrier can be narrow and long enough to accommodate any number of LED dies to collectively produce a narrow strip of light, the LED lighting module may be referred to in the following as a "lightbar".

Each driver of the lightbar may control any number of series-connected LEDs, for example three series-connected RGB mini-LEDs. The LEDs that are addressed by a single driver can be organized in channels. One such driver can be an off-the-shelf driver IC such as WS2811, which may be used in addressable RGB lighting applications. With this type of driver IC, only a single data input line may be used (although additional data input lines may be used in other embodiments). The drivers and their LED dies may be connected in a daisy-chain configuration, and a controller may be used to generate a suitable pulse train which propagates through the chain, turning the LED dies on/off as desired and modulating their intensities.

An LED lighting assembly can include at least one instance of the LED lighting module, and an interface module configured to convert input signals from a device controller into a data input signal for the LED lighting module.

A mobile electronic device may have a first housing part, a second housing part, at least one instance of the LED lighting module arranged at a junction between the first housing part and the second housing part, and an interface module between an LED lighting module and a controller of the mobile electronic device.

A method of manufacturing an LED lighting module may include providing a printed circuit carrier, providing a plurality of bare LED dies in which the area of the emission face of an LED die does not exceed 0.0625 mm$^2$, mounting the LED dies in a linear formation on the carrier, mounting a number of drivers on the carrier, and forming electrical connections between the drivers and the LED dies.

In some embodiments, an LED die maybe manufactured as a flip-chip die. The driver may be a packaged IC such as WS2811. The driver IC may be provided as a compact ball grid array (BGA) package. The printed circuit carrier may be made of any suitable material such as polyimide, polyethylene terephthalate, etc. The printed circuit carrier may have a single layer, with conductive tracks (usually copper) printed on its upper surface and possibly also conductive tracks printed on its undersurface. The dies and the drivers can be soldered to contact pads provided on the carrier in a suitable soldering process. The carrier may be a flexible printed circuit (FPC) carrier, and the lightbar realized as an FPC assembly (FPCA).

In some embodiments, the area of the emission face of a mini-LED die does not exceed 0.0625 mm$^2$. For example, a mini-LED may have an essentially rectangular emission surface with dimensions 0.24 mm×0.13 mm, i.e. with an area of only 0.0312 mm$^2$. The height of such small LEDs is low, in the order of 0.1 mm, so that such mini-LEDs are well suited for applications such as mobile devices, for which small form factors are used. Because of the small dimensions of the LEDs and the narrow width of the FPC, the light exit area of the lightbar can be narrow enough to be essentially invisible when the lightbar is in its off state.

Electrical connections from a mini-LED to the driver IC and the FPC depend on the LED manufacturing method. Lateral LEDs (for which the electrical contacts are generally both on the upper surface of the die) can be electrically connected using wirebonds. Flip-chip SMD LEDs can be connected using solder. Vertical LEDs (with one contact on the upper face and one contact on the lower face) can be connected using wirebond and solder connections as appropriate. Flip-Chip SMD LEDs may be used since they generally do not use additional packaging with a clear silicone or polymeric encapsulant, whereas wirebonded dies benefit from a protective encapsulant.

As indicated above, the lightbar can comprise any number of LED dies, and a suitable number of drivers in which each driver is configured to drive a number of the LED dies. For example, the LED dies may be organized in groups, each group may contain a red-emitting LED die, a green-emitting LED die and a blue-emitting LED die, and each driver can be configured to drive such a group.

In one embodiment, the LED dies and the drivers may all be mounted on the upper side of the FPC. For example, the LEDs groups and drivers may be arranged alternately along the FPC. Electrical connections to the conductive tracks and between the components may be made using solder and/or wirebonds as appropriate. The LEDs of a group can be arranged in a line perpendicular to the long edges of the FPC. The center-to-center pitch between adjacent LED dies of a group can be on the order of 0.3 mm. The width of the FPC carrier may be governed by the size of the driver IC package and its orientation relative to the LED dies. The package side length may be on the order of 0.75 mm. In such an embodiment, the width of the flexible carrier may be on the order of 1.5 mm. In this embodiment, the LED groups may be separated by intervals, since the drivers are placed between the LED groups.

In the embodiment described above, the LED dies may be effectively arranged in a linear formation that is a two-dimensional array. For example, 50 groups of RGB dies may be arranged in a 50×3 array, with all red-emitting mini-LEDs in a first row, all green-emitting mini-LEDs in the middle row, and all blue-emitting mini-LEDs in the final row.

In one embodiment, the LED dies may be mounted on the upper surface of the flexible carrier, and the drivers mounted on the lower surface of the flexible carrier. Electrical connections between the driver and the LEDs can be made using plated through-hole vias (PTHVs). Other electrical connections can be made using solder and/or wirebonds as appropriate. This allows various improvements to the product. For example, if the LEDs are arranged in RGB groups of three as described above, the center-to-center pitch between LED die of adjacent groups (i.e. between LEDs of the same color) can be at most 1.0 mm, or at most 0.5 mm, since the drivers are underneath the FPC. When lit up in its "on" state, the LEDs of the lightbar may thus appear collectively as a single light source.

The drivers can be mounted on the other side of the FPC with their "long sides" parallel to the edges of the FPC. This allows a further reduction in width of the FPC, which can be as narrow as 0.75 mm or even less. This narrow product width makes the lightbar suitable for use in space-constrained applications and allows the lightbar to be incorporated in novel ways in various electronic devices.

A two-dimensional array configuration may not be used in some embodiments, and instead the LED dies can be mounted in a single row on the upper FPC surface.

As one alternative to the RGB LEDs in the embodiments described above, the LED dies may be white-emitting.

In some embodiments, a lightbar may have at least 20 white-emitting LED dies, each with an emission area of approximately 0.0625 mm$^2$ and a luminance of 80 Mcd/m$^2$ so that together, the LEDs can achieve a luminous flux on the order of 300 lm, depending on their drive current. Such an embodiment would be suitable for a mobile phone rear camera application. Similarly, a group of white-emitting LEDs with a collective luminous flux in the order of 20 lm may be suitable for a front camera application of a mobile phone.

White-emitting LEDs can be arranged in parallel and/or in series, whereby the number of LEDs in series may be limited so that the total forward voltage does not exceed 42V for reasons known to one of skill in the arts.

A lightbar can be populated with various different kinds of white-emitting LEDs. For example, a dual-color arrangement in a camera flash application may deploy warm white LEDs as well as cool white LEDs so that the color of the flash illumination can be adjusted to the ambient lighting. In a triple-color application, three varieties of desaturated RGB LEDs are deployed, from reddish white, greenish white to blueish white, allowing full freedom of white color selection in combination with a broad spectrum allowing good color rendering for human vision.

In one embodiment, the LEDs of a lightbar may be organized in separately addressable strings or groups, so that the groups can be activated independently to achieve a variety of signaling functions.

To manufacture the lightbar, the mini-LEDs and drivers can be soldered to the FPC as described above. In one embodiment, overmoulding may be carried out to cover at least the driver ICs with a protective layer. The overmoulding material may be any suitable material such as silicone, or any suitable optically clear polymeric encapsulant. Overmoulding may be used in an embodiment in which the drivers are wirebonded to the conductive tracks of the FPC. Overmoulding may be avoided if flip-chip mini-LEDs and BGA-packaged drivers are used. Alternatively or in addition, a second flexible strip may be used to obtain a realization in which the driver ICs are "sandwiched" between FPC strips.

The lightbar can be incorporated in various ways in a mobile electronic device such as a smartphone. The dielectric material of the FPC can assume any desired shape and can adapt to the form of an underlying surface, so that the lightbar can follow essentially any contour in a three-dimensional space. For example, a lightbar can be arranged in a junction or gap between two opposing edges of adjacent housing parts. The width of the lightbar's "optical window" may be determined by the width of the gap between the housing parts. The small LEDs of the lightbar may pass the light efficiently through such a small gap. The efficiency can be improved by suitable light-guides and/or optics.

The housing parts may be on the rear surface of the mobile electronic device, on its front surface, along its sides, etc. For example, a junction between housing parts may be linear and may extend across the width of the mobile electronic device. A lightbar can be arranged in this junction. A lightbar can also follow the contour of an underlying "hill" or "valley" in the housing design of a mobile device. In another embodiment, the junction between adjacent housing parts may be essentially circular, for example following a circular or oval form around the lenses of a camera unit of the mobile electronic device. Such an "enclosing" flash can provide very favorable illumination for photography. In another embodiment, one or more lightbars can be arranged at a junction between a glass touchscreen and a housing. Such an embodiment can be used to achieve interesting lighting effects in conjunction with apps running on the mobile device. A control interface as described above can "feed" a lightbar with an input data string in order to achieve the desired lighting effect. For example, a lightbar arranged alongside the display of a mobile device and comprising RGB LEDs may be driven so that it emits a color tone tuned to the average color in the display, so that the lightbar appears as an extension of the display.

Figure 1:
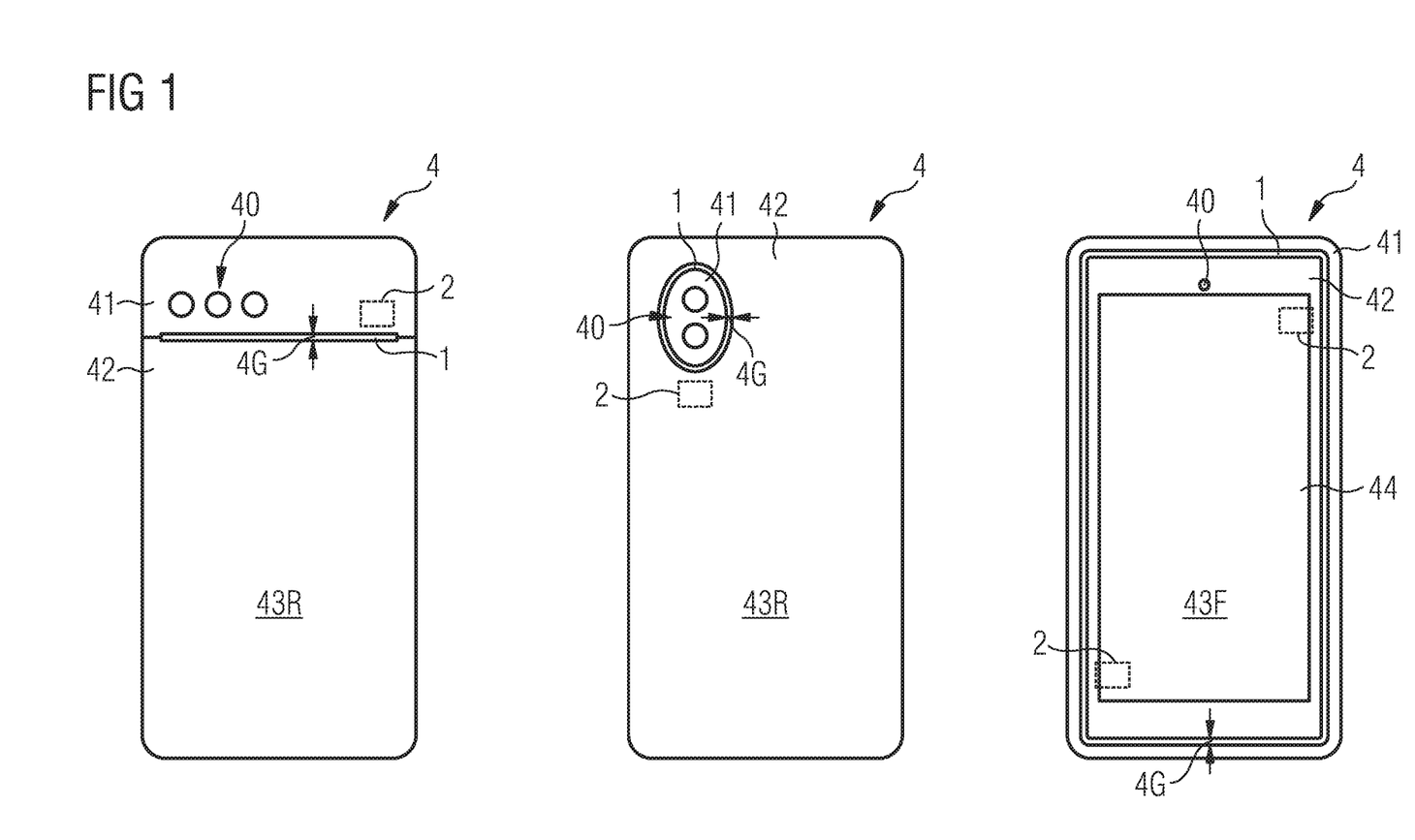
FIG. 1 shows instances of a lightbar incorporated in mobile electronic devices.

FIG. 1 shows various embodiments of mobile electronic devices 4 that can incorporate one or more instances of the mini-LED lightbar. On the left, the diagram shows the rear 43R of a mobile electronic device 4. This device 4 has a camera unit 40 indicated here by the three camera lenses. A camera flash is provided in the form of an instance of the mini-LED lightbar 1, which extends horizontally over the rear surface 43R of the device 4. The lightbar 1 can be placed at the junction of two housing parts 41, 42 thereby complementing the device design features. The internal position of a connector/controller 2 is indicated by the dotted lines. The connector/controller 2 is used to integrate the lightbar 1 with other functions of the mobile device 4, for example to allow the lightbar 1 to be used as a flash when a photograph is being taken using the camera unit 40, to provide an optical indicator of battery life, etc. In the middle, the diagram shows the rear of another mobile electronic device 4. This device 4 has a camera assembly 40 indicated here by two camera lenses. An instance of the mini-LED lightbar 1 is arranged as an oval to enclose the camera unit 40. Again, the lightbar 1 can fit into a junction between two housing parts 41, 42. This realization can be used to provide optimal flash illumination for images taken using the rear camera. As described above, the internal position of a connector/controller 2 is indicated by the dotted lines. On the right, the diagram shows the front of a mobile electronic device 4. This device 4 has a small front camera unit 40. Several instances of the mini-LED lightbar 1 are arranged on the front 43F of the device 4, and can be placed for example at the junction of a glass cover 42 (of a touch-sensitive display 44) and a housing 41. Here also, the internal position of a connector/controller 2 is indicated by the dotted lines. In this embodiment, one or more of the lightbars 1 can be used in conjunction with various other functions of the mobile device 4 in addition to providing illumination for the camera. For example, the lightbars 1 can be used to enhance social media messaging, to provide "mood lighting" accompanying music played on the mobile device, to provide a visual response when locking/unlocking the mobile device, to pulsate lightly (to "breathe") when the device 4 is connected to a charger, etc. The lightbars 1 may also deploy infrared LEDs ("IR-LEDs"), which can be used in a face-recognition application (e.g. to unlock a mobile phone), in a relighting application (e.g. to more favorably illuminate the face when using the device during a video conference), etc.

Figure 2:
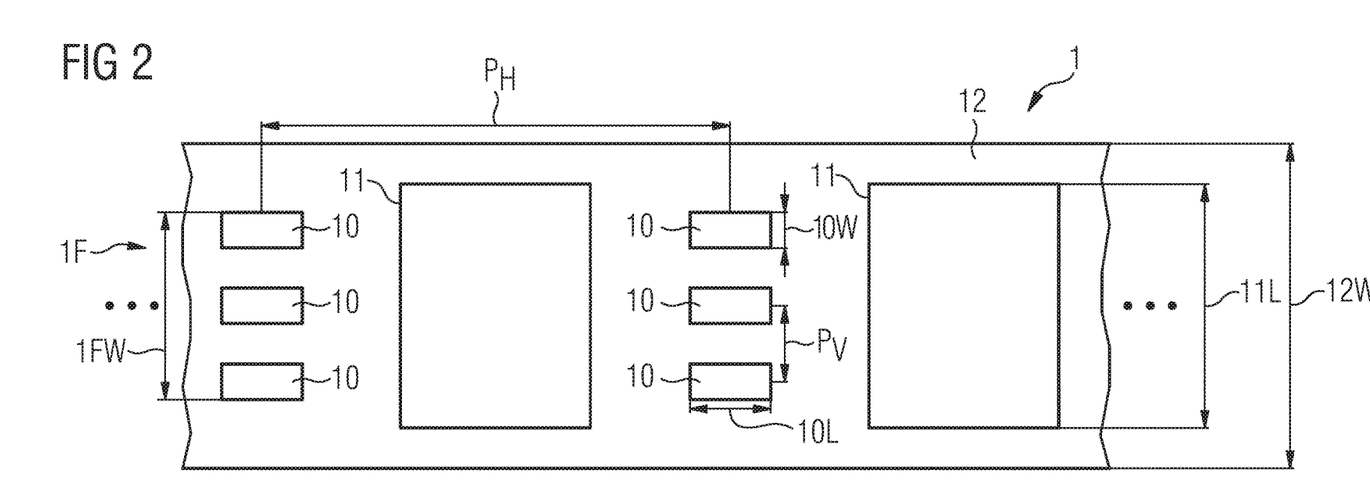
FIG. 2 illustrates a first embodiment of the lightbar.

FIG. 2 shows a simplified representation of a portion of an embodiment of the lightbar 1. In this embodiment, dies 10 are arranged in RGB groups of three in an essentially linear die formation 1F. The dies 10 are arranged on the upper surface of an FPC 12. Driver ICs 11 are arranged between the RGB LED groups.

Each mini-LED 10 has a rectangular emission face with a length 10L on the order of 0.24 mm and a width 10W in the order of 0.13 mm. In this exemplary embodiment, the center-to-center pitch Pv is 0.2 mm between dies of a group. The width 1FW of the linear die formation 1F is therefore only 0.53 mm. Between groups, the center-to-center pitch PH is 0.6 mm. A driver such as the WS2811 can be provided as a flip-chip SMD, for example with a BGA or copper pillars. The package may has a side length 11L in the order of 0.75 mm. The space between LED die groups is at least as wide as the driver width 11W, since each driver IC 11 is placed beside its die group in order to simplify routing of the FPC and to allow full addressability. This basic LED/driver configuration is known from addressable LED applications such as modular light strips for indoor lighting applications. As described, the large package dimensions mean that other light strips cannot be used in size-constrained applications such as mobile devices.

Figure 3:
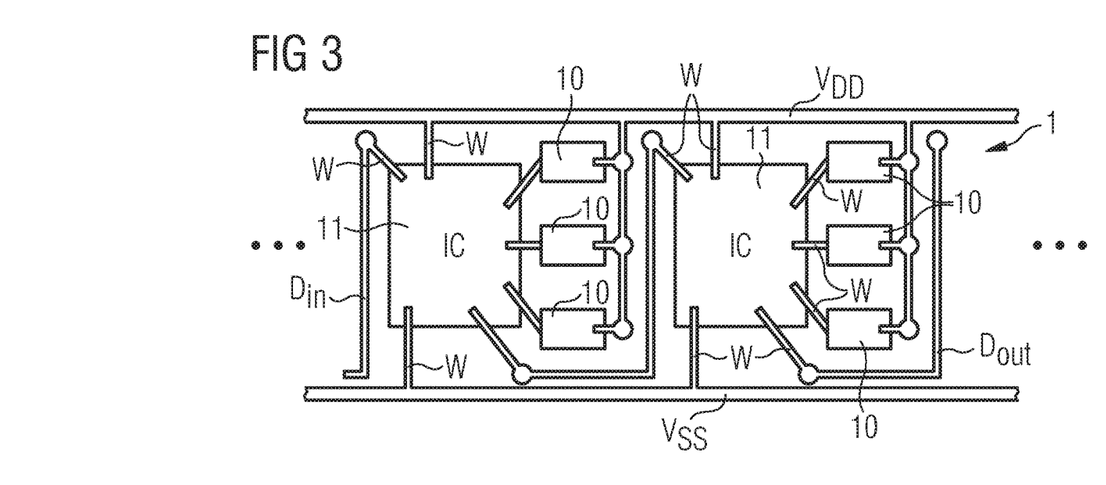
FIG. 3 illustrates an enlarged portion of the lightbar of FIG. 2.
Figure 4:
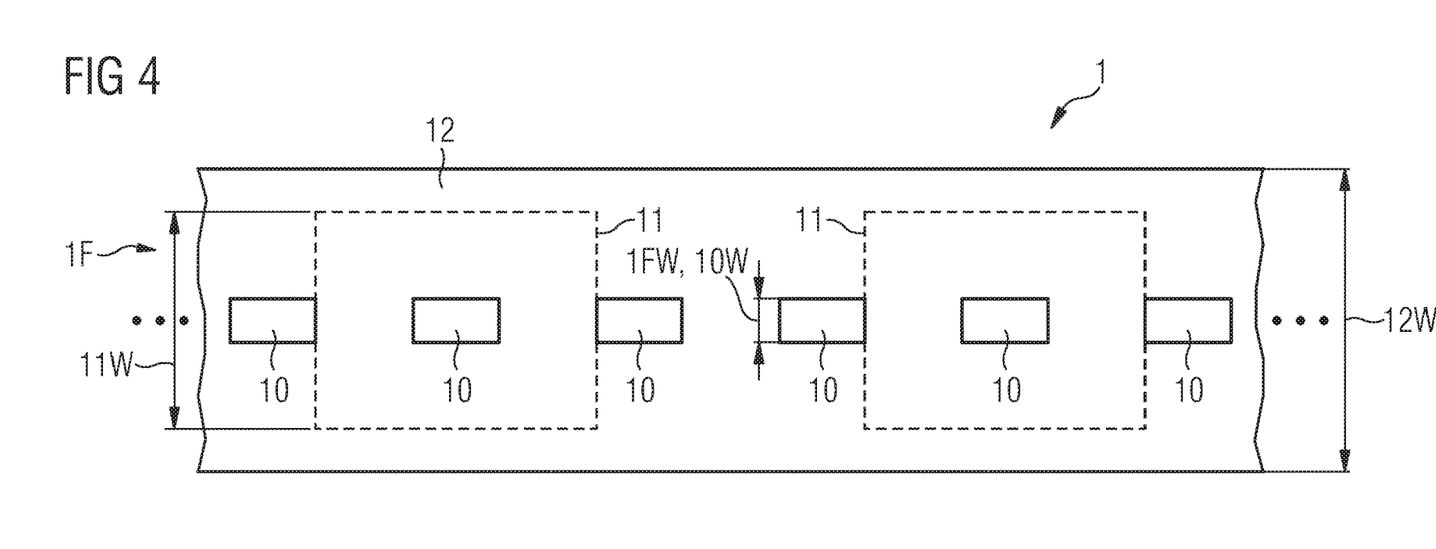
FIG. 4 illustrates a second embodiment of the lightbar.
Figure 5:
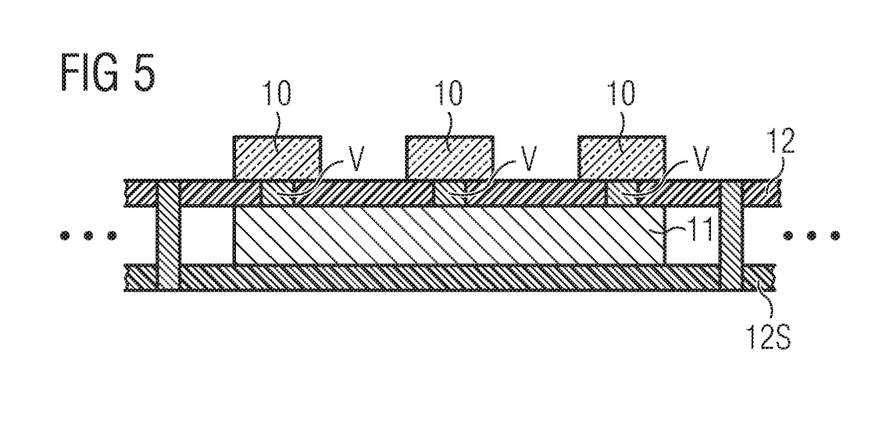
FIG. 5 illustrates a cross-sectional view of the lightbar of FIG. 4.
Figure 6:
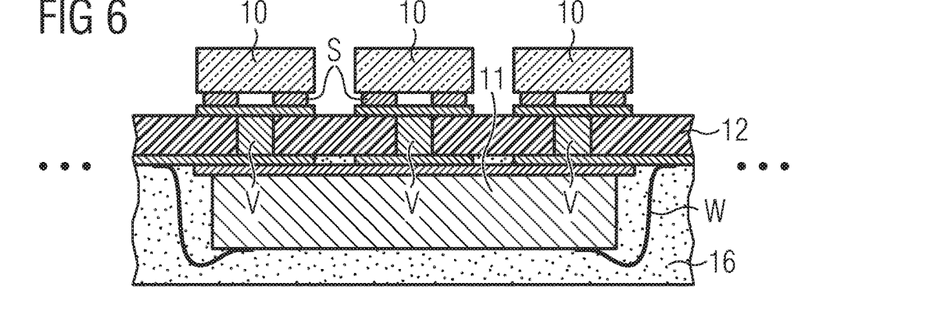
FIG. 6 illustrates a configuration of the lightbar.
Figure 7:
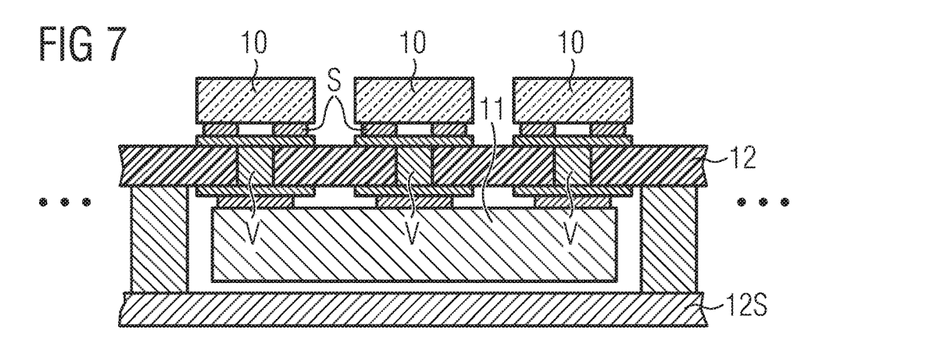
FIG. 7 illustrates another configuration of the lightbar.
Figure 8:
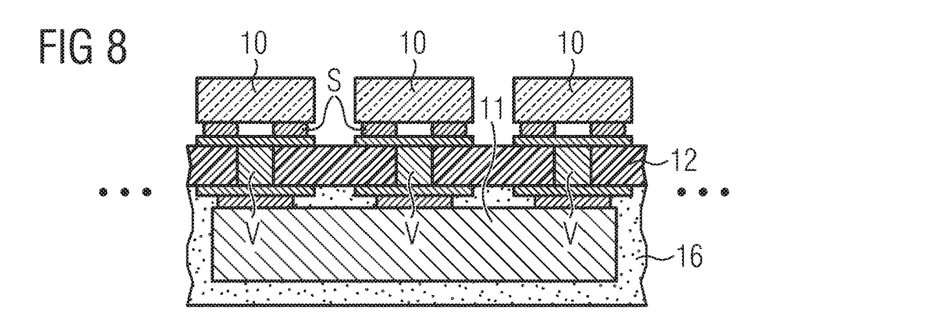
FIG. 8 illustrates another configuration of the lightbar.
Figure 9:
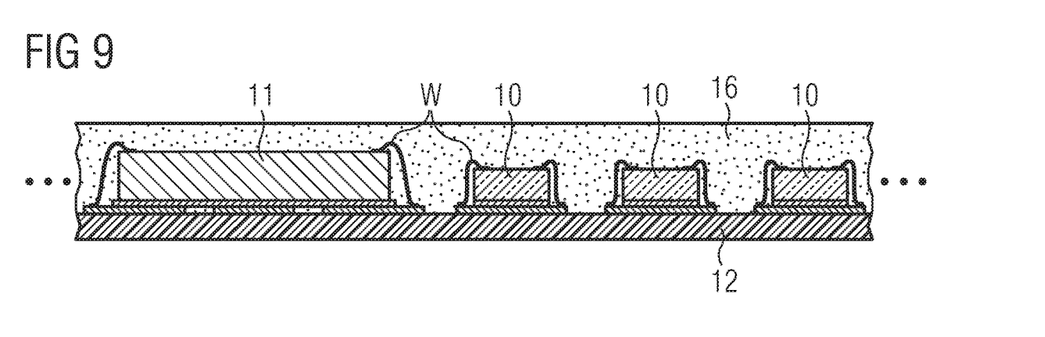
FIG. 9 illustrates another configuration of the lightbar.
Figure 10:
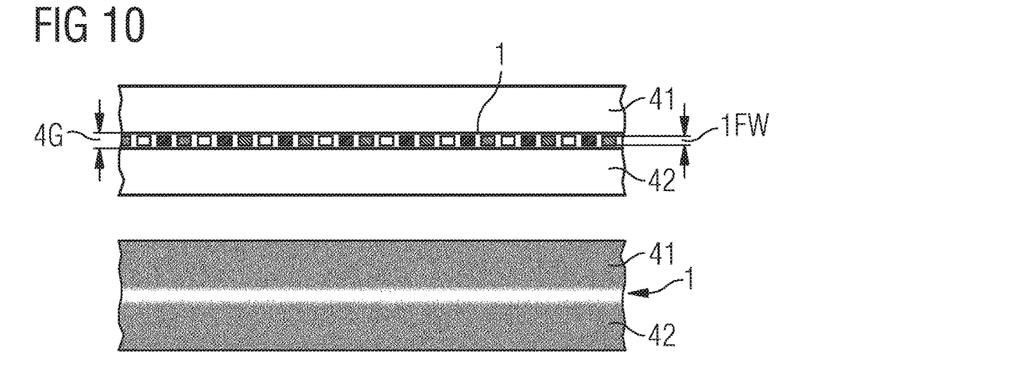
FIG. 10 illustrates effects of various embodiments of the lightbar.
Figure 11:
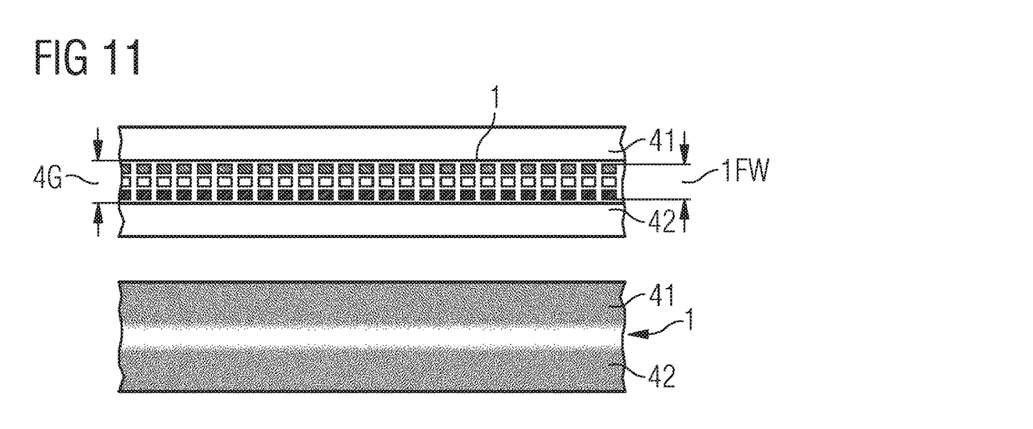
FIG. 11 illustrates further effects of various embodiments of the lightbar.
Figure 12:
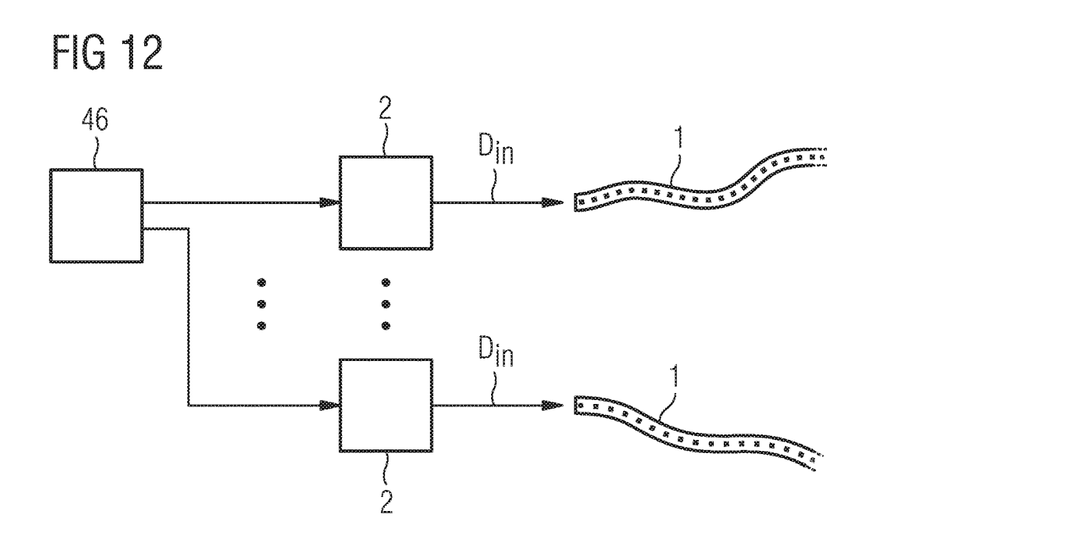
FIG. 12 is a simplified block diagram of a mobile device incorporating instances of the lightbar.

In this embodiment of the lightbar 1, the "bare" die LEDs and driver IC packages are mounted as SMD or flip-chip components directly on the FPC, so that a product with a favorably narrow width 12W is possible. The LEDs and driver ICs can be mounted on the same side of the FPC 12 as shown here and in FIG. 3, and connections between the LEDs 10, the drivers 11 and the conductive tracks $V_{DD}$, $V_{SS}$, $D_{in}$, $D_{out}$ can be made using wirebonds W. The width 12W of the FPC 12 can be as narrow as 1.0 mm, and is constrained in this embodiment only by the driver side length 11L. As mentioned above, placement of the drivers and LED dies on the same side of the FPC results in "empty space" between the die groups when the lightbar is in its "on" state. The FPC width 12W can be reduced by exploiting the separate mounting possibilities for the LED dies and the drivers as shown in the following diagrams. The "optical window" of the embodiment shown here may be determined by the driver side length 11L, i.e. this embodiment of the lightbar can be arranged in a gap between two housing parts, which gap may be only slightly larger than the driver side length 11L. FIGS. 4 and 5 illustrate an embodiment in which LEDs 10 and driver ICs 11 are arranged on opposite sides of an FPC 12. Electrical connections are made by plated through-hole vias V as shown in FIG. 5. Here, the driver ICs 11 are "sandwiched" between the upper FPC 12 and a further FPC 12S that supports the assembly. The diagram shows vertical $V_{SS}/V_{DD}$ connections between the upper FPC 12 and the lower FPC 12S, which in this embodiment are used to connect tracks on the upper FCP 12 to $V_{SS}/V_{DD}$ buses on the lower FPC 12S. Because the orientation of the driver IC 11 and the positions of the dies are not constrained as was the case in the configuration of FIGS. 2 and 3, this realization can achieve a narrow product width 12W on the order of 0.75 mm, making best use of the narrow width 10W of the bare die LEDs 10. The width 1FW of the linear die formation 1F in this case is the same as the LED die width 10W. In this case also, the overall product width is limited essentially only by the driver IC width 11W, so that an even narrower product could be obtained by using a smaller IC package. In this embodiment, the "optical window" is determined by the width 1FW of the linear die formation 1F, i.e. by the width 10W of the LED die 10, so that this lightbar can be placed in an extremely narrow gap between two housing parts, i.e. the gap (4G in FIG. 1) may only be slightly wider than the LED width 10W. FIGS. 6-9 illustrate the results of various exemplary manufacturing methods. Each diagram shows a portion of a lightbar 1, and it shall be understood that the lightbar 1 can extend indefinitely to the left or right. In FIG. 6, LED dies 10 and their driver IC 11 are arranged on opposite sides of an FPC 12. The LED dies 10 can be an RGB group as explained in the previous embodiments. Electrical connections to the conductive tracks of the FPC 12 are made by solder bonds S, plated through-hole vias V and wirebonds W. The driver IC 11 and the wirebonds W are covered by protective overmoulding 16. The LED dies 10 are not overmoulded, so that a device manufacturer can combine the lightbar 1 with a desired optical element such as a diffuser, a lens, etc. To manufacture this embodiment, an FPC 12 is prepared with PTHVs and conductive tracks. The SMD driver IC 11 is then soldered into place on the "underside" of the FPC 12. In a subsequent step, wirebonds are made between conductive tracks and the driver IC 11. This partial assembly is then overmoulded. The SMD dies 10 are then soldered onto contact pads on the "upper" side of the FPC 12. In any of the embodiments described herein, a conductive adhesive such as silver epoxy may be used as an alternative to solder. In FIG. 7, LED dies 10 and their driver IC 11 are again arranged on opposite sides of an FPC 12. The LED dies 10 can be an RGB group as explained in the previous embodiments. Electrical connections to the conductive tracks of the FPC 12 are made by solder bonds S and plated through-hole vias V. Here, the driver ICs 11 are "sandwiched" between the upper FPC 12 and a further FPC 12S that supports the assembly. Again, the LED dies 10 are not overmoulded, so that a device manufacturer can combine the lightbar 1 with a desired optical element such as a diffuser, a lens, etc. Manufacture of this embodiment is similar to the method described with FIG. 6 above, using the second flexible strip 12S in place of overmoulding. The embodiment shown in FIG. 8 is similar, with overmoulding 16 to protect the driver IC 11. Here, all electrical connections between the FPC tracks, the driver IC 11 and the dies 10 are made using vias, solder bonds and/or conductive adhesive, as appropriate. FIG. 9 shows an embodiment based on FIGS. 2 and 3 above, and shows wirebonded driver ICs and dies 10, enclosed in a protective overmoulding 16. FIGS. 10 and 11 illustrate the effects that can be achieved when the inventive lightbar 1 is built into an electronic device such as a smartphone (as explained in FIG. 1). The diagrams each show an embodiment of a lightbar 1 and its corresponding implementation between two housing parts 41, 42 of the smartphone. The housing parts 41, 42 are separated by a gap 4G, determining the "optical window" of the lightbar 1, i.e. the width of the space through which the emitted light can be seen. For purposes of illustration, the housing parts 41, 42 are assumed to have a dark color such as black. The diagrams show straight lightbars 1 but it shall be understood that any curved realization is equally possible. In the upper part of FIG. 10, the lightbar 1 comprises a linear arrangement of dies, in this case RGB dies 10 with driver ICs underneath the FPC (for example as explained in FIG. 4 and FIG. 5). Such a realization can be used for example at the front of the smartphone to achieve lighting effects that may be synchronized with various apps running on the smartphone. A realization with white LEDs could be used in a flash application as described above. In one embodiment, the wavelengths peaks of red, green and blue LEDs can be 460 nm, 530 nm, 620 nm respectively. Of course, when used in conjunction with a camera application, the wavelengths peaks may be chosen to complement the sensitivity of the camera's image sensor. In an embodiment with dual-tone white LEDs, a warm white may have a correlated color temperature (CCT) of at most 2800 K, while a cool white may have a CCT of at least 5500 K. A single-color white LED may have a CCT in the order of 4500 K. In FIG. 11, the lightbar 1 comprises three rows of RGB die groups, arranged so that dies of one color are all in the same row. The FPC could also be populated with a fourth row of white-emitting LEDs. Such a realization can be used on the front and/or rear of a mobile device for a camera flash application, a signaling application, etc. Placing LEDs of the same color in rows allows close packing of the different colors. Additional optical elements may be arranged over the lightbar, e.g. optics, a light-guide, a diffuser, etc. A "rainbow" impression can be achieved if desired, by allowing the individual colors to remain visible through an optical element FIG. 12 shows a simplified block diagram, indicating how the lightbar 1 may be used to augment the functionality of an electronic device 4. A device such as a smartphone generally has various controllers, indicated here collectively as a control arrangement 46. Various functions of the device 4 can utilize one or more instances of the lightbar 1. The control arrangement 46 can issue sets of control signals as appropriate, for example when one lightbar 1 (with white LEDs) is to be used as a camera flash, another lightbar 1 (with RGB LEDs) is to be used to provide decorative light effects, etc. A set of control signals is converted by the corresponding interface module 2, which issues a suitable pulse train to its lightbar 1. The control signals set the appropriate LED currents, or define the duty cycles if the LEDs are driven using pulse-width modulation (PWM). For example, the white LEDs of a lightbar can be driven with maximum current when it is to be used in a flash application. If the lightbar deploys dual-color or triple-color white LEDs, the white nuance can be adjusted to achieve a desired flash color. A lightbar with RGB LEDs may be driven to allow only a single color (e.g. green) to slowly increase and decrease its brightness to give the impression of "breathing" when the mobile device is connected to a charger. Although various embodiments have been disclosed, it will be understood that numerous additional modifications and variations could be made thereto without departing from the scope of the disclosure. For example, the LED dies can be manufactured as top emitters or side emitters. The optical elements arranged over a lightbar (and between two housing parts of a device) can comprise any of a diffuser, a light-guide, an imaging optical element, a non-imaging optical element, a plain transparent window that serves only to encapsulate the lightbar components, etc. In an embodiment in which the driver ICs and the LED dies are mounted on the same side of the FPC, the effect of "empty space" between the components can be avoided by using a suitable light-guide. A driver may be used to address a single RGB or RGBW group of dies. Equally, a driver may be used to address several such groups or to address several channels. A driver can control the bias current to the LED dies and/or may apply PWM tuning. In addition to the possibility of deploying RGB and white dies mentioned above, a lightbar may deploy infrared LEDs (for use with a face recognition application) and/or ultraviolet LEDs (for use with an application to detect counterfeit currency). The embodiments described above make use of the advantageous properties of an FPC as carrier, since the flexible and thin dielectric material can be shaped to fit into a wide variety of applications. Of course, the mini-LEDs of a lightbar with dimensions as described above could be placed on a carrier with low or minimal flexibility.

The features of the embodiments described herein may be combined in any appropriate way. The LED dies of the lightbar can be arranged on the carrier in a one or more rows; the lightbar can comprise any combination of red-emitting and/or green-emitting and/or blue-emitting and/or white-emitting dies; the LED dies and the drivers can be arranged on one side of the carrier or distributed on both upper and lower sides.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A mobile electronic device comprising:
 a first housing part having an opening for a unit;
 a second housing part; and
 at least one light emitting diode (LED) lighting module arranged at a junction between the first housing part and the second housing part, the at least one LED lighting module at least partially encircling the first housing part and comprising a plurality of LEDs, the first and second housing parts combined to form a front of the mobile electronic device or combined to form a rear of the mobile electronic device.

2. The mobile electronic device according to claim 1, wherein the at least one LED lighting module is disposed at the rear of the mobile electronic device and is configured to completely encircle the first housing part.

3. The mobile electronic device according to claim 1, wherein the first and second housing parts combine to form the front of the mobile electronic device.

4. The mobile electronic device according to claim 1, wherein the first and second housing parts combine to form the rear of the mobile electronic device.

5. The mobile electronic device according to claim 1, wherein the at least one LED lighting module is disposed at the front of the mobile electronic device and extends essentially around a perimeter of the mobile electronic device.

6. The mobile electronic device according to claim 1, wherein:
 the first housing part comprises a touchscreen display, and
 the at least one LED lighting module is configured to provide a color tone tuned to an average color in the touchscreen display to appear as an extension of the touchscreen display.

7. The mobile electronic device according to claim 1, further comprising a battery, the at least one LED lighting module configured to provide an optical indicator of battery life of the battery.

8. The mobile electronic device according to claim 1, wherein the at least one LED lighting module is configured to provide mood lighting accompanying music played on the mobile electronic device.

9. The mobile electronic device according to claim 1, wherein the at least one LED lighting module is configured to provide a visual response in response to at least one of locking or unlocking the mobile electronic device.

10. The mobile electronic device according to claim 1, wherein the at least one LED lighting module is configured to provide pulsation in response to the mobile electronic device being connected to a charger.

11. The mobile electronic device according to claim 1, wherein the at least one LED lighting module comprises:
 a flexible carrier on which the plurality of LEDs is mounted, and
 a plurality of drivers mounted on the flexible carrier and connected to drive the plurality of LEDs.

12. The mobile electronic device according to claim 11, wherein:
 the flexible carrier comprises a strip of dielectric material and conductive circuit tracks printed on the dielectric material,
 the plurality of LEDs comprises bare LED dice mounted in a linear die formation on the flexible carrier, a width of the linear die formation limited to about 0.75 mm, and an area of an emission face of each of the bare LED dice limited to about 0.0625 mm$^2$, and
 an interface module is disposed between the at least one LED lighting module and a controller of the mobile electronic device.

13. The mobile electronic device according to according to claim 12, wherein:
 the bare LED dice are organized in groups,
 each group contains a red-emitting LED die, a green-emitting LED die and a blue-emitting LED die,
 each driver is configured to drive a different one of the groups, and
 one of each driver is disposed on:
 a same side of the carrier as the bare LED dice and between adjacent groups, or
 an opposite side of the carrier as the LED dice.

14. The mobile electronic device according to claim 13, wherein:
 each group is arranged in a line perpendicular to long edges of the carrier, and
 a center-to-center pitch between adjacent LED dice of each group is about 0.3 mm.

15. The mobile electronic device according to claim 13, wherein the red-emitting LED dice are in a first row, the green-emitting LED dice are in a second row, and the blue-emitting LED dice are a third row.

16. The mobile electronic device according to claim 1, further comprising a camera unit disposed within the opening of the first housing part, the at least one LED lighting module configured to act as a flash during image capture by the camera unit.

17. The mobile electronic device according to claim 1, wherein the at least one LED lighting module is configured to follow a contour of an underlying hill or valley in a housing design of the mobile electronic device.

18. The mobile electronic device according to claim 1, wherein the at least one LED lighting module is configured to emit infrared light used by at least one of a facial-recognition or relighting application.

19. An electronic device cover comprising:
 a first housing part;

a second housing part; and at least one light emitting diode (LED) lighting module arranged at a junction between the first housing part and the second housing part, the at least one LED lighting module at least partially encircling the first housing part and comprising a plurality of LEDs, the first and second housing parts combined to form a front of the electronic device or combined to form a rear of the electronic device.

20. A method of manufacturing a mobile electronic device, comprising:

mounting light emitting diode (LED) dice in a linear die formation on a printed circuit carrier, a width of the die formation limited to about 0.75 mm, an area of an emission face of each of the LED dice limited to about 0.0625 mm$^2$;

mounting drivers on the carrier;

forming electrical connections between the drivers and the LED dice to form an LED lighting module; and mounting the LED lighting module between housing parts such that the LED lighting module at least partially encircles one of the housing parts.

\* \* \* \* \*

UNITED STATES PATENT AND TRADEMARK OFFICE
CERTIFICATE OF CORRECTION

| | |
|---|---|
| PATENT NO. | : 11,982,431 B2 |
| APPLICATION NO. | : 17/926974 |
| DATED | : May 14, 2024 |
| INVENTOR(S) | : Pfeffer et al. |

It is certified that error appears in the above-identified patent and that said Letters Patent is hereby corrected as shown below:

On the Title Page

On page 2, in Column 1, item (57) under "Abstract", Line 3, delete "mm2." and insert --$mm^2$.-- therefor In the Claims In Column 10, Lines 32-33, in Claim 13, delete "according to according to" and insert --according to-- therefor In Column 10, Line 52, in Claim 15, after "are", insert --in--

Signed and Sealed this
Eighth Day of October, 2024

Katherine Kelly Vidal
*Director of the United States Patent and Trademark Office*